(12) United States Patent
Thagard et al.

(10) Patent No.: US 6,356,031 B1
(45) Date of Patent: Mar. 12, 2002

(54) ELECTROLUMINESCENT PLASTIC DEVICES WITH AN INTEGRAL THIN FILM SOLAR CELL

(75) Inventors: Gregory B. Thagard; Randolph M. Blotky, both of Los Angeles; John H. Dargan, Palos Verdes Estates, all of CA (US)

(73) Assignee: Time Warner Entertainment Co, LP, Burbank, CA (US)

( * ) Notice: Subject to any disclaimer, the term of this patent is extended or adjusted under 35 U.S.C. 154(b) by 0 days.

(21) Appl. No.: 09/563,562

(22) Filed: May 3, 2000

(51) Int. Cl.⁷ .................................................. G09G 3/10
(52) U.S. Cl. .................... 315/169.3; 313/506; 313/507; 257/21; 257/458
(58) Field of Search ................... 315/169.3, 169.1; 313/504, 507, 506, 509, 497; 257/21, 40, 103, 458

(56) References Cited

U.S. PATENT DOCUMENTS

| | | | |
|---|---|---|---|
| 4,719,385 A | * | 1/1988 | Barrow et al. ............... 313/463 |
| 5,008,579 A | * | 4/1991 | Conley et al. ............ 313/504 X |
| 5,247,190 A | | 9/1993 | Friend et al. |
| 5,514,878 A | | 5/1996 | Holmes et al. |
| 5,821,690 A | | 10/1998 | Martens et al. |
| 5,828,117 A | | 10/1998 | Kondo et al. |
| 5,828,121 A | | 10/1998 | Lur et al. |
| 5,871,591 A | | 2/1999 | Ruby et al. |

* cited by examiner

*Primary Examiner*—Haissa Philogene
(74) *Attorney, Agent, or Firm*—Gottlieb, Rackman & Reisman, P.C.

(57) ABSTRACT

A composite multi-layered display device consists of two components: a light emitting component which can be used to generate and display images, and a generating component such as a solar cell which generates an electrical current in the presence of light. The two components are incorporated into corresponding co-extensive layers, with the light emitting component being light transmissive to allow external light to impinge on the generating component. Preferably, the light emitting component includes a light emitting polymer material and the generating component includes a solar cell which includes amorphous silicon.

40 Claims, 3 Drawing Sheets

ELECTROLUMINESCENT PLASTIC DEVICES WITH AN INTEGRAL THIN FILM SOLAR CELL

BACKGROUND OF THE INVENTION

A. Field of the Invention

This invention pertains to electroluminescent devices, and more particularly, to devices incorporating at least one light emitting layer made of a polymer material combined with a thin film solar cell providing an electrical current.

B. Background of the Invention

Electroluminescent (EL) devices have become popular as lighting sources for watches, clocks, radios, and the like. Early EL devices were capable of generating light only at a single wavelength, and were very rigid and fragile. More recently, electroluminescent materials have been discovered which are flexible so that they can be shaped into various geometric configurations. Typically, such electroluminescent devices include one or more layers of a semiconductive conjugated polymer (generally referred to as light emitting polymer or LEP) placed between two contact layers. The contact layers are used to inject charge carriers into the polymer layer. These charge carriers then combine within the polymer layer into charge carrier pairs which decay, generating radiation in the visible wavelengths. Devices of this type can be incorporated into various apparatus for generating light. U.S. Pat. No. 5,828,117 discloses, for example, a luminescent device with two light emissive layers adapted to radiate light of two colors.

OBJECTIVES AND SUMMARY OF THE INVENTION

It is an objective of the present invention to provide a composite device which includes an EL source and a coextensive solar cell.

A further objective is to provide a composite device of the type described above in which, at least in one configuration, electrodes are shared between the two components thereby reducing its complexity and thickness.

Other objectives and advantages of the invention shall become apparent from the following description.

Briefly, a device constructed in accordance with this invention includes at least two spaced, layered semiconductor components: a light emitting component adapted to selectively generate light in the presence of an electrical field, and a generating component capable of generating electricity. Several display elements may be formed in the light emitting component which cooperate to selectively generate images. The light emitting component may include for instance an LEP or other EL materials.

The generating component is made of a thin film semiconductor material adapted to generate an electric current in response to light. The thin film semiconductor material may comprise an active layer made, for example, of amorphous silicon adapted to generate positive and negative charges when light impinges thereon.

Each component is provided with electrodes. The electrodes for the light emitting component are used to apply the required electrical field, and the electrodes of the generating component are provided to collect the positive and negative charges within the thin film, which charges result in a current flow. In an alternate embodiment of the invention, an electrode is shared between the two components. The electrodes may be provided in the form of layers of a conductive material.

The light emitting component may be formed of a plurality of discrete light emitting elements disposed, for instance, in a two-dimensional array. Semiconductor switches may also be provided to selectively activate these discrete light emitting elements. A non-conductive transparent material is provided between the discrete light emitting elements to complete the light emitting component. This material allows external light to propagate through the display component and to impinge on the generating component.

DETAILED DESCRIPTION OF THE INVENTION

Figure 1:
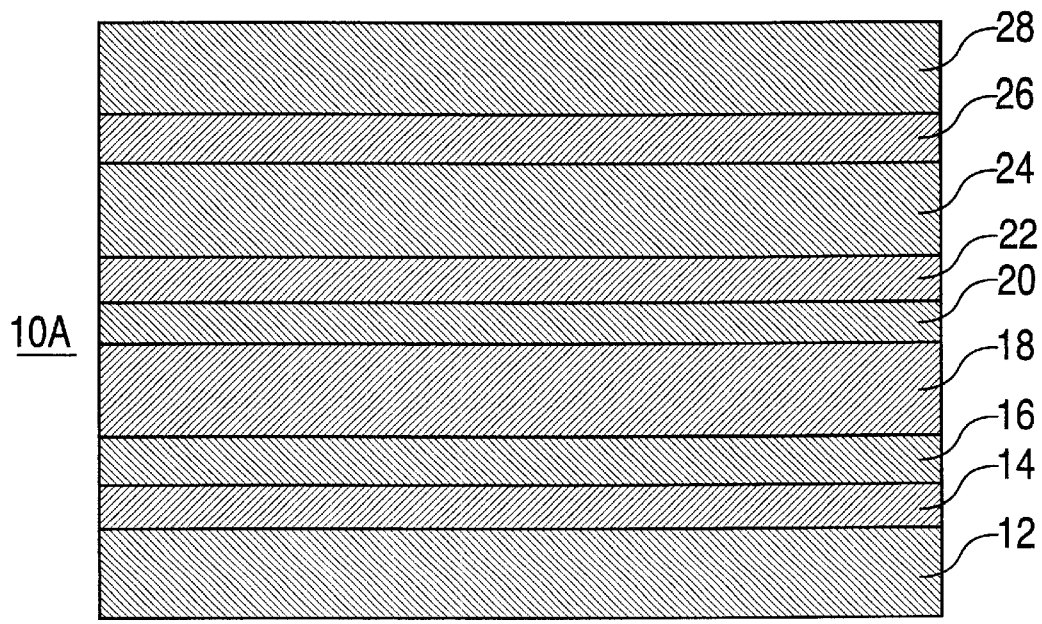
FIG. 1 shows somewhat diagrammatically a cross-sectional view of a first embodiment of a composite device in accordance with this invention.

Referring now to FIG. 1, a composite device 10A constructed in accordance with this invention consists of several layers. First, there is provided a substrate or base 12 made of any strong non-conductive material to provide structural strength and stability for the device. All the subsequent layers are deposited sequentially on this substrate using standard techniques known in the art.

The first layer, shown on top of the substrate 12, is a conductive layer 14. Next, there is provided a thin film semiconductor layer 16 made, for example, of an amorphous silicon layer defining a p-i-n junction. On top of layer 16 there is provided another conductive layer 18 made of a transparent material. For example, layer 18 may be made of a metal oxide such as indium tin oxide, tin oxide, or zinc oxide.

The three layers described so far, i.e. layers 14, 16, and 18 cooperate to form the generating component in the form of a thin film solar cell. Cells of this type are described, for example, in U.S. Pat. No. 5,828,117, incorporated herein by reference.

Layer 18 is covered with a protective layer 20 of a non-conductive material, such as silicone oxide, to isolate it from the subsequent layers.

On top of layer 20, there is provided another conductive layer 22 also made of a transparent material like layer 18. On top of layer 22, there is provided a layer 24 having electroluminescent properties. For example, layer 24 could be a conjugated polymer.

On top of layer 24, there is provided a fourth conductive layer 26. Like layers 22 and 18, this layer is also made of a transparent material.

Finally, the last layer provided is a protective layer 28 made of a non-conductive material. Layer 28 should be relatively hard to protect the layers disposed underneath it.

Layers 22, 24, and 26 cooperate to form a light emitting component. More particularly, when a voltage is applied between electrode layers 22 and 26, an electric field is generated in layer 24 causing it to be light emissive. Electroluminescent structures of this kind are described, for example, in U.S. Pat. Nos. 5,247,190 and 5,821,690, incorporated herein by reference. It should be understood that the light emitting component could include more than one polymer layer, as described in U.S. Pat. No. 5,891,690 mentioned hereinabove, each layer emitting light at a different wavelength.

An important feature of the described structure is that all the layers disposed above the thin film semiconductive layer 16, i.e., layers 18, 20, 22, 24, 26, and 28, are light transmissive, i.e., transparent or at least translucent to allow a substantial amount of the ambient light to penetrate these layers and reach layer 16.

In summary, composite device 10A consists of two layered components: a light emitting component defined by lower layers 22, 24, and 26 and a generating component defined by upper layers 16, 18, and 20.

Figure 2:
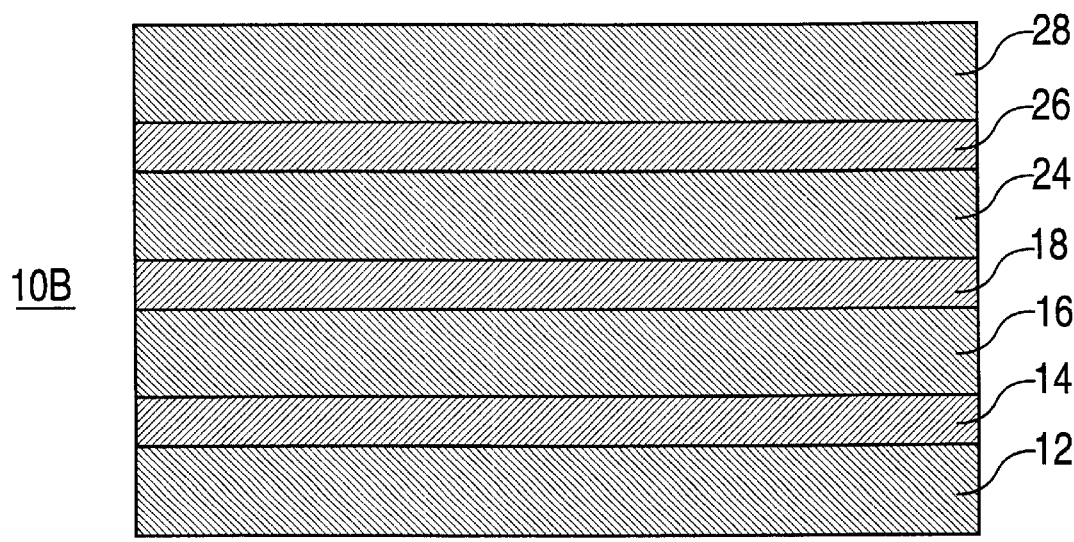
FIG. 2 shows a cross-sectional view of a second embodiment of the invention.

Some of the elements of the two components of the device 10 may be shared thereby resulting in a structure which is thinner, cheaper, and easier to manufacture. One such structure in which the two components share elements is shown in FIG. 2. In this Figure, device 10B includes a base 12 and layers 14, 16, and 18 having the same function as in FIG. 1.

Next, since the layer 18 is shared, the light emitting polymer (LEP) layer 24 is disposed on layer 18 as shown. The LEP layer 24 is then followed by conductive layer 26. Finally, the protective layer 28 is provided on top of the conductive layer 26 to protect the whole device from water or humidity.

The light emitting component may comprise a continuous uniform element which generates light of a pre-selected wavelength when subjected to an electrical field. Alternatively, the light emitting component may comprise a plurality of discrete light emitting elements dispersed, for example, in a two-dimensional array. In this configuration, each discrete light emitting element may define a pixel for a digital display. By selectively activating these discrete light emitting elements, any image may be generated by the light emitting component. (In such a case, at least one of the conductive layers comprises separate lines.) Alternatively, one or more discrete light emitting elements may be shaped to form distinct image elements. In either of these last two configurations, electronic switches must be provided to selectively activate the discrete light emitting elements.

Figure 3:
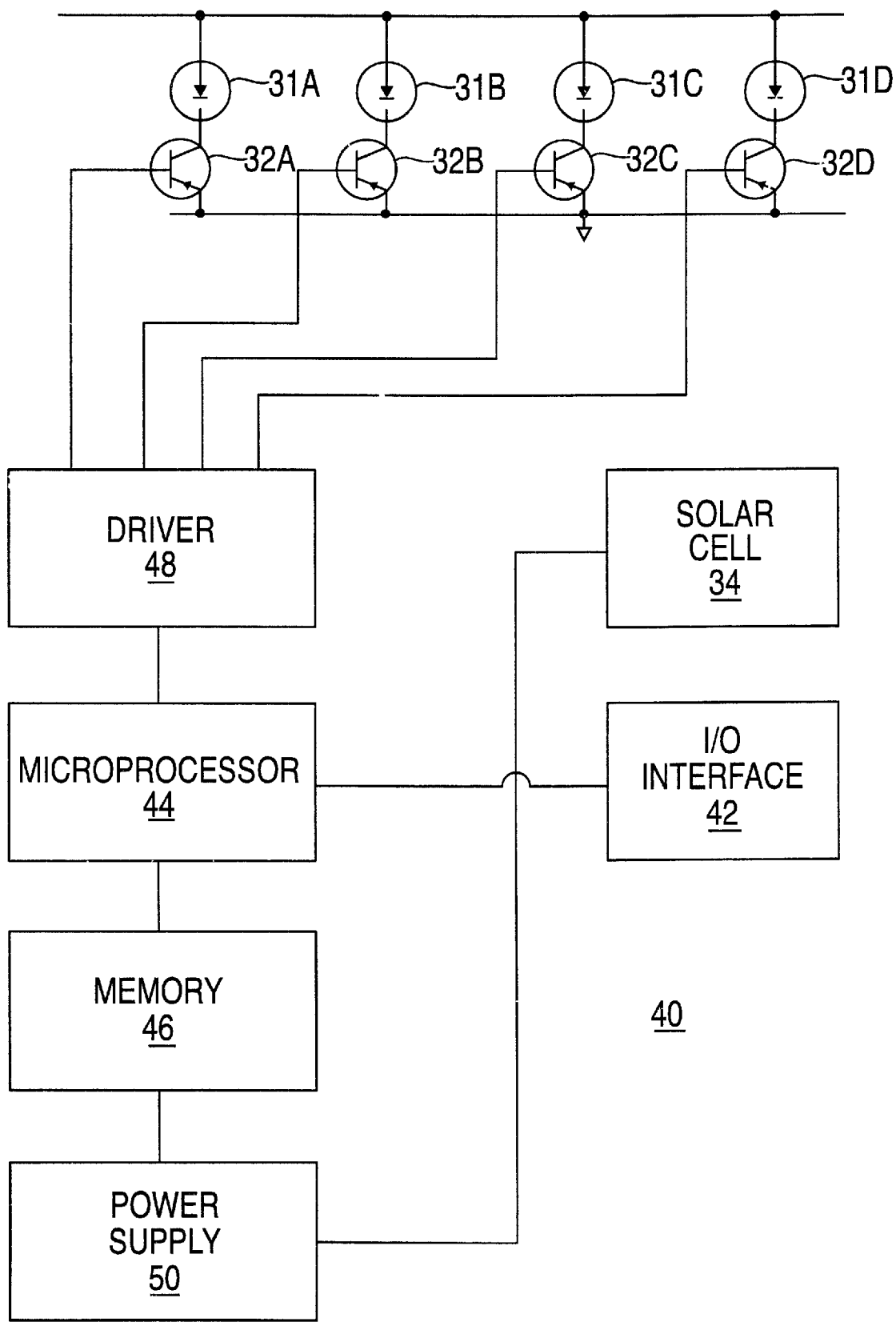
FIG. 3 shows a schematic diagram of an electronic display incorporating the dual-purpose device of the present invention.

FIG. 3 shows an electronic display circuit 40 using a composite device 10 of FIGS. 1 and 2. For the purposes of FIG. 3, the composite device 10 is illustrated as comprising a light emitting component 32 and a generating component such as a solar cell 34. The light emitting component 32 is shown as comprising a plurality of light emitting diodes 31A–31D and transistors 32A–32D. Each diode 31A–31D represents a light emitting element, such as a pixel or an image section.

The circuit 40 includes an input/output interface 42, a microprocessor 44, a memory 46, and a driver 48. The memory 46 holds imaging information related to various images to be displayed. In response to commands from I/O interface 42, the microprocessor 44 retrieves the corresponding imaging data from the memory 46 and transmits it to a driver 48. The driver 48 uses this digital data to generate output signals used to activate one or more of the transistors 32A–32D thereby generating a corresponding picture or image by diodes 31A–31D.

Each transistor 32A–32D is connected to a corresponding light emitting diode 31A–31D, and is turned on by activation signals from driver 48.

The power generated by solar cell 34 is used to augment power supply 50. Alternatively, for a circuit with small power requirements, the solar cell 34 may generate sufficient power so that a separate power supply 50 may be unnecessary. For example, if the component 32 is relatively small and/or is constructed to show only a single image, then all the other elements of the circuit of FIG. 3 may be provided integrally with the solar cell.

Figure 4:
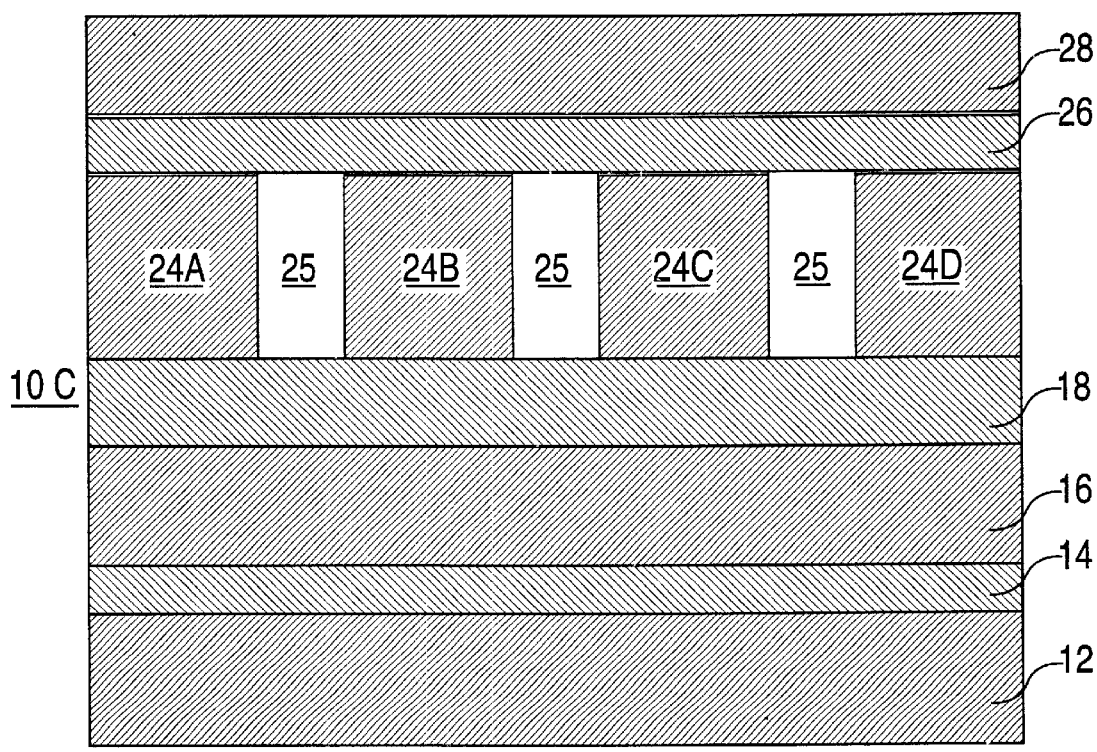
FIG. 4 shows a cross-sectional view of a third embodiment of the invention.

An alternate embodiment of the invention is shown in FIG. 4. In this figure, a device 10C is shown with substrates 12–18, and 26–28 identified with the embodiment of FIG. 2. The continuous active LEP layer 24 is replaced in this embodiment with discrete display LEP elements 24A–24D which can be individually activated. The spaces between elements 24A–24D are filled with a clear material as at 25 to allow external light to pass through to the solar cell formed by layers 14–18. Each of the elements 24A preferably includes a light emitting element and a switch for selectively activating said element, as illustrated in FIG. 3.

The whole structure is provided with a protective nonconductive layer 28.

As in the embodiment of FIG. 1, layer 16 is formed of formed of an amorphous silicon to define a p-i-n junction. Layers 18, 24A, 26, and 28, disposed above layer 18, are transparent to allow light to impinge on layer 16 thereby generating electricity. Since a substantial portion of the layers 16 and 18 are not covered by elements 24A–D, these latter elements need not be transparent. However, obviously for best results, they should be at least translucent as well to expose the solar cell to as much light as possible.

In summary, FIG. 1, 2, and 4 present two alternate structures for a composite device. FIG. 1 shows a structure in which the light emitting component and the generating component are defined separately as independent elements. In FIGS. 2 and 4, the components are interconnected to share some of the elements. While in FIGS. 1 and 2 somewhat homogenous structures are presented, in FIG. 4, instead of a single continuous display layer, a plurality of discrete light emitting elements are shown, each light emitting element being provided with an integral switching element used to selectively activate each light emitting element. This latter configuration allows the generation of complex colorful images.

An advantage of LEP's is that they can be flexible and, hence, can be formed into various three-dimensional shapes. Similarly, the devices shown in FIGS. 1–4 can be made flexible as well.

Obviously, numerous modifications can be made to this invention without departing from its scope as defined in the appended claims.

We claim:

1. A composite display device comprising:
    a generating component forming a thin film solar cell arranged to generate electricity in response to light; and
    a light emitting component attached to and co-planar with said generating component and forming an electroluminescent device arranged to generate light in response to electrical signals applied thereto, said light emitting component being light transmissive to allow light to pass therethrough and impinge on said generating component.

2. The device of claim 1 wherein said light emitting component comprises a light emitting polymer.

3. The device of claim 1 further comprising a base supporting said generating and said light emitting components.

4. The device of claim 1 further comprising a transparent protective layer disposed on said light emitting component.

5. The device of claim 1 wherein said generating component comprises in sequence a first conductive layer, an active layer made of a semiconductor material and a second conductive layer, wherein said active layer is adapted to generate positive and negative charges in the presence of light, and wherein said first and second conductive layers are adapted to collect said positive and negative charges, respectively.

6. The device of claim 1 wherein said light emitting component includes a first conductive layer, an active layer and a second layer, said first and second layers being adapted to selectively apply an electrical field to said active layer, said active layer generating light in response to said electric field.

7. The device of claim 1 wherein said generating and said light emitting components have electrodes, including some electrodes which are shared between said components.

8. A composite display device comprising:
a generating component formed of an amorphous silicon defining a thin film semiconductor and adapted to generate an electrical current when light impinges thereon; and
a light emitting component attached to said generating component and including a light emitting polymer adapted to generate light in the presence of an electrical field.

9. The device of claim 8 further comprising a first, second, third and fourth electrode, said first and second electrodes being associated with said generating component to collect said electrical current and said third and fourth electrodes being associated with said light emitting component to apply said electrical field.

10. The device of claim 9 wherein at least some of said electrodes comprise layers of a conductive material which is substantially co-extensive with one of said generating and light emitting components.

11. The device of claim 9 wherein said second and third electrodes are adjacent, further comprising an insulator layer electrically separating said second and third electrodes.

12. The device of claim 8 further comprising a first, second and third electrode, said first and second electrodes cooperating to collect said electrical current, and said second and third electrodes cooperating to apply said electrical field.

13. The device of claim 8 wherein said light emitting component is light transmissive to allow light to impinge on said generating component.

14. The device of claim 8 wherein said light emitting component comprises a plurality of discrete light emitting elements dispersed in said display device.

15. The device of claim 14 wherein each said discrete light emitting element includes a first electrode zone, a second electrode zone and a semiconductor material disposed between said electrode zones and adapted to generate light in response to an electric signal between said electrode zones.

16. The device of claim 15 wherein said semiconductor material is a light emitting polymer.

17. The device of claim 14 further comprising a plurality of electronic switches adapted to selectively activate said discrete light emitting elements.

18. The device of claim 17 further comprising conductors extending to said electronic switches and adapted to provide switching signals to said electronic switches.

19. The device of claim 14 further comprising a transparent layer made of a non-conductive material, said discrete light emitting elements being imbedded in said transparent layer.

20. A composite display device comprising:
a power generating component forming a thin film solar cell arranged to generate electrical power from ambient light; and
a light emitting component attached to said generating component and arranged to generate light, said light emitting component being excited at least in part by electrical power from said power generating component.

21. The device of claim 20 wherein said light emitting component comprises a light emitting polymer.

22. The device of claim 20 further comprising a base supporting said power generating and said light emitting components.

23. The device of claim 20 further comprising a transparent protective layer disposed on said light emitting and said power generating components.

24. The device of claim 20 wherein said light emitting component is disposed in a layer over said power generating component.

25. The device of claim 24 wherein said layer comprises a light transmissive material and a plurality of light emitting elements disposed in said light transmissive material.

26. The device of claim 25 wherein said light transmissive material is arranged to allow ambient light to pass therethrough and to impinge on said power generating component.

27. The device of claim 20 wherein said power generating component comprises in sequence a first conductive layer, an active layer made of a semiconductor material and a second conductive layer, wherein said active layer generates positive and negative charges in the presence of light, and wherein said first and second conductive layers collect said positive and negative charges, respectively.

28. The device of claim 20 wherein said light emitting component includes a first conductive layer, an active layer and a second layer, said first and second layers being adapted to selectively apply an electrical field to said active layer, said active layer generating light in response to said electric field, said electric field being excited by power from said power generating component.

29. A composite display device comprising:
a generating component forming a thin film solar cell arranged to generate electricity in response to light; and
a light emitting component attached to and co-planar with said generating component and forming an electroluminescent device arranged to generate light in response to electrical signals applied thereto;
wherein said generating and said light emitting components have electrodes, including some electrodes which are shared between said components.

30. A composite display device comprising:
a generating component formed of an amorphous silicon defining a thin film semiconductor and adapted to generate an electrical current when ambient light impinges thereon;
a light emitting component attached to said generating component and including a light emitting polymer adapted to generate light in the presence of an electrical field associated with said electrical current;
a first, second, third and fourth electrode, said first and second electrodes being associated with said generating component to collect said electrical current and said third and fourth electrodes being associated with said light emitting component to apply said electrical field.

31. The device of claim 30 wherein at least some of said electrodes comprise layers of a conductive material which is substantially co-extensive with one of said generating and light emitting components.

32. The device of claim 30 wherein said second and third electrodes are adjacent, further comprising an insulator layer electrically separating said second and third electrodes.

33. The device of claim 30 wherein said light emitting component comprises a plurality of discrete light emitting elements dispersed in said display device.

34. A composite display device comprising:
   a generating component formed of an amorphous silicon defining a thin film semiconductor and adapted to generate an electrical current when ambient light impinges thereon;
   a light emitting component attached to said generating component and including a light emitting polymer adapted to generate light in the presence of an electrical field associated with said electrical current;
   a first, second and third electrode, said first and second electrodes cooperating to collect said electrical current, an said second and third electrodes cooperating to apply said electrical field.

35. A composite display device comprising:
   a generating component formed of an amorphous silicon defining a thin film semiconductor and adapted to generate an electrical current when ambient light impinges thereon; and
   a light emitting component attached to said generating component and including a light emitting polymer adapted to generate light in the presence of an electrical field associated with said electrical current;
   wherein said light emitting component comprises a plurality of discrete light emitting elements.

36. The device of claim 35 wherein each said discrete light emitting element includes a first electrode zone, a second electrode zone and a semiconductor material disposed between said electrode zones and adapted to generate light in response to an electric signal between said electrode zones.

37. The device of claim 36 wherein said semiconductor material is a light emitting polymer.

38. The device of claim 37 further comprising a plurality of electronic switches adapted to selectively activate said discrete light emitting elements.

39. The device of claim 38 further comprising conductors extending to said electronic switches and adapted to provide switching signals to said electronic switches.

40. The device of claim 35 further comprising a transparent layer made of a non-conductive material, said discrete light emitting elements being imbedded in said transparent layer.

* * * * *